United States Patent [19]

Tresset et al.

[11] Patent Number: 4,922,509
[45] Date of Patent: May 1, 1990

[54] METHOD OF IMPLEMENTING PROGRAMMABLE MATCHED FILTERS, AND CORRESPONDING FILTERS AND FILTER BANKS

[75] Inventors: Alain Tresset, Saint Michel Sur Orge; François Fontenelle, Antony; Gérard Javard, Savigny Sur Orge, all of France

[73] Assignee: CGEE Alsthom, Perret, France

[21] Appl. No.: 212,386

[22] Filed: Jun. 27, 1988

[30] Foreign Application Priority Data

Jun. 26, 1987 [FR] France ............................... 87 09040

[51] Int. Cl.$^5$ ............................................ H04B 1/10
[52] U.S. Cl. .................................. 375/103; 333/165; 364/825
[58] Field of Search ............... 375/96, 103; 333/165, 333/166, 175, 176; 307/221 D; 364/724,725, 726, 825

[56] References Cited

U.S. PATENT DOCUMENTS

| | | | |
|---|---|---|---|
| 3,061,680 | 10/1962 | Frankel | 333/165 |
| 3,886,316 | 5/1975 | Getgen | 333/165 |
| 4,101,853 | 7/1978 | Kosugi | 333/176 |
| 4,293,831 | 10/1981 | Lueder | 307/221 D |
| 4,338,581 | 7/1982 | Morgan | 333/165 |
| 4,441,090 | 4/1984 | Warren | 333/166 |

OTHER PUBLICATIONS

R. Schreiber et al., IEEE Journal of Solid-State Circuits, vol. Sc16, No. 3, pp. 125-129, Jun. 1981, USA.
H. Kosugi, The Transaction of IECE of Japan, vol. E59, No. 8, p. 8, Aug. 1976, Japan.
O. Muller, Der Elektroniker, vol. 16, No. 6, pp. EL7-–EL72, Jun. 1976, Switzerland.

Primary Examiner—Robert L. Griffin
Assistant Examiner—Stephen Chin
Attorney, Agent, or Firm—Sughrue, Mion, Zinn, Macpeak & Seas

[57] ABSTRACT

The invention relates to a method of implementing programmable tuned filters, in particular for telegraph signal receivers, and also to tuned filters obtained by the method. A resonator (16) organized around a multipath filter and controlled by a first clock signal is associated with a comb filter (17) organized around a delay line (21) and controlled by a second clock signal, in order to constitute a tuned filter which is programmed by the clock signals. The invention is applicable to making programmable tuned filters and banks of such filters, in particular for remote protection equipment in grids for transporting electrical power.

9 Claims, 3 Drawing Sheets

METHOD OF IMPLEMENTING PROGRAMMABLE MATCHED FILTERS, AND CORRESPONDING FILTERS AND FILTER BANKS

The present invention relates to a method of implementing programmable matched filters, in particular for a telegraph signal receiver in teleprotection, i.e. in specific remote control equipment. The invention also relates to filters and to banks of filters implemented in this way.

BACKGROUND OF THE INVENTION

In high tension power transport networks, it is conventional to interchange information between stations situated at the ends of the power transport lines via said lines, in particular for controlling apparatus at the stations and for signalling faults.

Information is often interchanged in telegraphic form by manipulating the amplitude, the frequency, or the phase of signals at predetermined frequency, in particular using the techniques known by the following sets of initials (in English): ASK, FSK or MFSK, and PSK or DPSK. The number of predetermined frequencies varies depending on the technique used, and may be one frequency only in the simplest of cases.

For various reasons, the predetermined frequencies used for conveying information are generally selected to lie in the telephone band and they are used to modulate high frequency carrier waves which are conveyed by the power transport lines. By selecting the telephone band, it is also possible to transmit these frequencies over a telephone connection, should that be deemed desirable. The transmission of information over power transport lines is liable to take place under highly adverse conditions if the transport lines are disturbed by interference or by electrical faults.

However, it is necessary for teleprotection equipment that is intended to receive such information to be as reliable as possible under the worst possible conditions if they are to perform their function, in particular if they are to control protective apparatuses.

This implies, inter alia, a very high degree of recognition reliability in the telegraph signal receivers for receiving the transmitted information, and consequently highly effective frequency filtering in order to extract useful signals from the interferring noise in which they are embedded. Attempts are therefore made to implement matched filters in order to eliminate noise and to augment signals at one of said predetermined frequencies.

In addition, it is desirable to be able to set up banks of identical filters which are tuned to different frequencies, or to be able to modify the tuning of the filters in a simple manner on request in order to enable users to select the predetermined frequencies that they need without requiring the structure of the filters to be modified, as is required when the filters are implemented using conventional analog techniques.

To this end, the present invention therefore proposes a method of implementing programmable matched filters, in particular for a telegraph signal receiver in teleprotection equipment, and it also proposes the corresponding filters and banks of filters.

SUMMARY OF THE INVENTION

The present invention provides a method of implementing programmable matched filters, in particular for a teleprotection receiver of information transmitted telegraphically by manipulating amplitude, frequency, or phase, and the corresponding filters and banks of filters wherein, in order to obtain filters suitable for being programmed on request, a single matched filter combines, in cascade, at least one high-selectivity resonator organized about a multipath filter which is controlled by a first clock signal, whereby the center frequency of the matched filter is fixed, and at least one comb filter organized about a delay line of the charge transfer type which is controlled by a second clock signal, whereby the lobe width of the matched filter is fixed.

The present invention also provides a programmable matched filter for receiving information transmitted telegraphically by modulating amplitude, frequency, or phase, in particular for teleprotection equipment, the filter comprising at least one high-selectivity resonator organized around a multipath filter, and at least one comb filter organized about a delay line of the charge transfer type, said resonator and comb filter being controlled by clock signals which fix the resonance frequency of the resonator and the lobe width of the comb filter, with the frequency of the clock signal applied to the comb filter and frequency of the clock signal applied to the resonator being selected in such a manner that the resonance frequency of the resonator is equal to an integer multiple of the lobe width.

BRIEF DESCRIPTION OF THE DRAWINGS

Embodiments of the invention are described by way of example with reference to the accompanying drawings, in which.

MORE DETAILED DESCRIPTION

Figure 1:
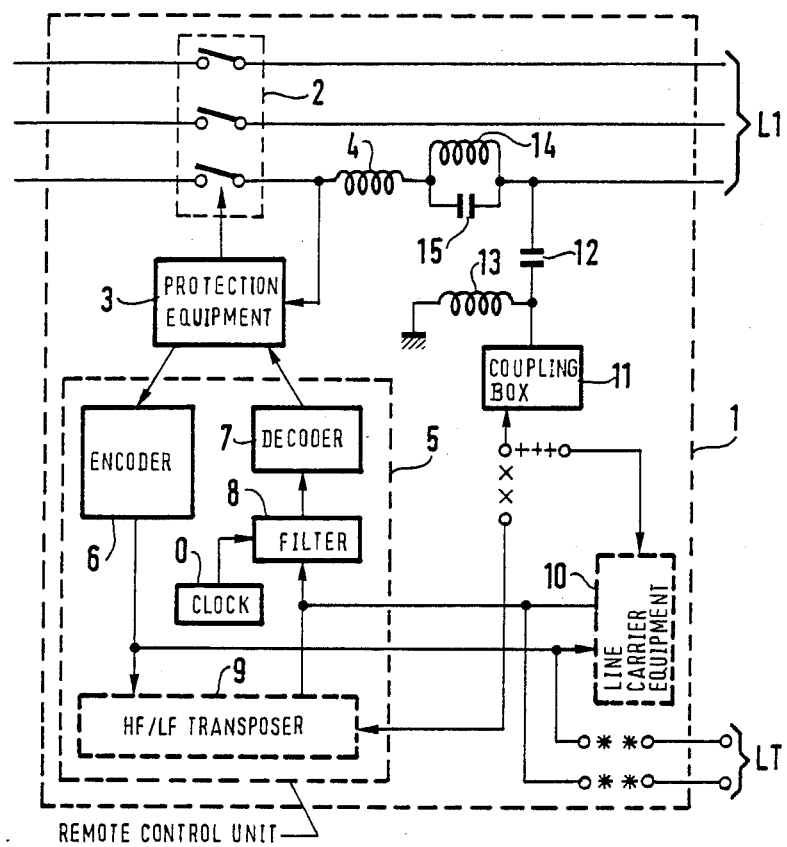
FIG. 1 is a block diagram of a part of a station in a power grid and including a filter in accordance with the invention.

As mentioned above, the method of implementation in accordance with the invention is more particularly intended for use in providing programmable matched filters and banks thereof, and in particular filters intended to be used at the inputs to the telegraph signal receivers to be found in teleprotection equipment of high tension electrical power distribution networks.

Conventionally, teleprotection equipment is placed in the stations situated at the ends of power transport lines, for example station 1 which is assumed to be located at one end of a three-phase power transport line L1 in a mesh network.

The station 1 conventionally includes protective circuit breakers 2 for opening the line, when necessary.

These circuit breakers 2 are controlled by protection equipment 3 provided, in particular, with electrical measuring means as symbolized by measuring transformer 4, and with communications means both for transmission and for reception purposes, in particular for communication with the station (not shown) situated at the other end of the three-phase line L1.

To this end, the protection equipment 3 is connected to teleprotection equipment 5 and interchanges information therewith in the form of binary on/off electrical signals.

The teleprotection equipment 5 is intended to transmit information between the stations under consideration, and this normally implies converting on/off signals into signals that can be transmitted over long distances and which can be recovered in spite of the existing noise in which they are embedded.

Various types of remote protection equipment 5 can be envisaged. In one conventional form, the on/off signals produced by the protection equipment 3 are converted into telegraph signals which are encoded by keying amplitude, frequency, or phase within the telephone band inside a channel in said band. Conversely, the remote protection equipment 5 is suitable for receiving and for recognizing information transmitted in telegraphic form by keying amplitude, frequency, or phase at the remote control equipment (not shown) located at the station situated at the other end of the three-phase line L1 so as to enable it to control the protection equipment 3 accordingly, in a manner appropriate thereto.

In order to perform these operations, the remote protection equipment 5 includes a low frequency transmit stage 6 which receives signals from the protection equipment 3 and which converts them into low frequency encoded signals, and also a low frequency receive stage 7 which converts the low frequency encoded signals reaching the station 1 into controlling voltage or current signals.

Telegraph signals are applied to the low frequency receive stage 7 via at least one filter 8 in order to extract from the ambient noise those predetermined low frequencies which correspond to the codes selected by the power transport grid operator for operating requirements.

In this case, the filter 8 is matched, programmable, and controlled by a clock 0.

The output from the low frequency transmit stage 6 and the input to the matched filter 8 are suitable for connection to various transmission means for the purpose of interchanging information between the station 1 and the station (not shown) situated at the other end of the three-phase line L1.

This transmission means may be a reserved telephone line LT in a public or a private telephone network, and it may equally well be the three-phase line L1 itself, in particular when no telephone connection exists between the two stations concerned.

Low frequency encoded signals are transmitted, for example, over a channel of a conventional system 10 for applying carrier current to the carrier, said system being connected to the three-phase line L1 and being external to the remote protection equipment 5. The low frequency encoded signals may also be transmitted by means of a high frequency unit 9 including a transmitter stage and a receiver stage for transposing the low frequency encoded signals to a high frequency for transmission over the three-phase line L1, and also for performing the inverse transformation.

The high frequency portion 9 or the carrier current system 10 is connected to the three-phase line L1 via a conventional coupling box 11 which is connected to one of the wires of the three-phase line L1 via a coupling capacitor 12 associated with a ground leak inductor 13.

A linetrap circuit comprising an inductor 14 and a capacitor 15 conventionally limits the transmission of modulated high frequency signals to only that portion of the wire in the three-phase line L1 which connects the station 1 to the station situated at the other end of said three-phase line.

It will readily be understood that such transmission may be subject to a very high level of interference under various circumstances in which it is important for it to operate properly, for example when controlling circuit breaker switching.

Figure 3:
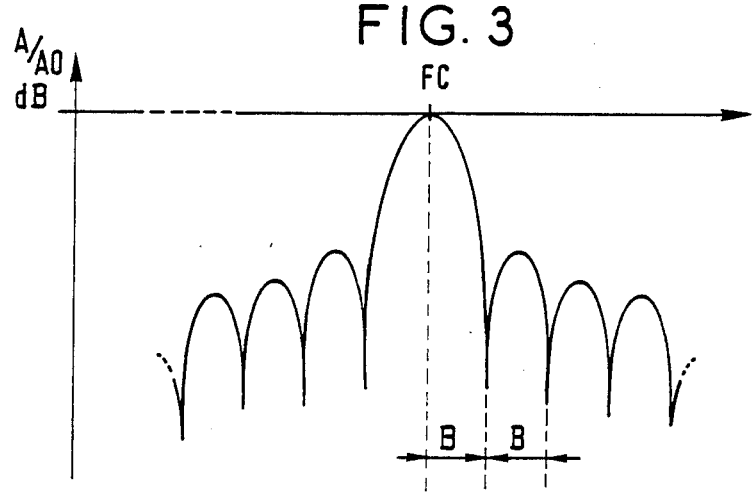
FIG. 3 shows the attenuation characteristic of a matched filter.

It is therefore necessary to filter the signals received by the low frequency receive stage 7 by means of at least one filter 8. In order to optimize the results, it is advisable to use a matched filter or a bank of matched filters for extracting the, or each, predetermined low encoding frequency selected by the grid operator. The frequency response of such a filter is shown in FIG. 3.

Such filtering for a given low frequency is performed, in accordance with the invention, by associating a resonator such as 16 or 16″ having high selectivity centered on the "center" frequency Fc, with a comb filter such as 17′ or 17″ having one of its frequencies of maximum attenuation corresponding to the frequency Fc.

Figure 2:
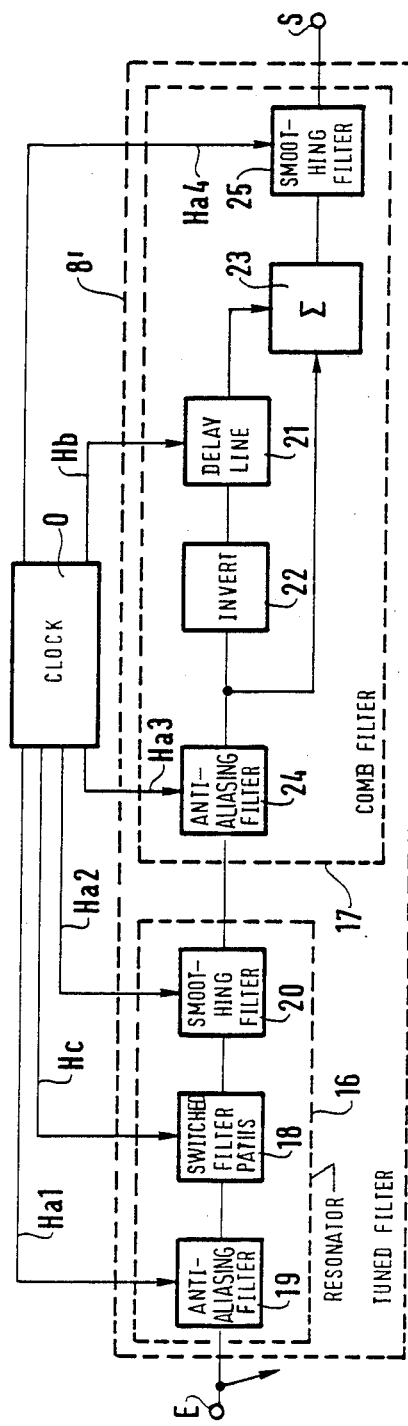
FIG. 2 is a block diagram of a first filter in accordance with the invention.

In a first embodiment shown in FIG. 2, the resonator 16 is located upstream from the comb filter 17 within the matched filter which is given the reference 8′ in this case.

A multipath filter 18 constitutes the essential component around which the resonator 16 is organized. This multipath filter comprises, for example, four paths each constituted by a lowpass section H(jw) each of which is switched in succession in conventional manner at the rate of a clock signal of frequency Fc provided by the clock 0. The clock is conventionally constituted by a quartz crystal providing a high degree of stability and a frequency synthesizer for generating the clock signals required, such as Hc, on the basis of the signal from the quartz crystal.

Each lowpass section path in the filter 18 is constituted, for example, by means of an active integrator, or else merely by an RC circuit.

In this case, since the filter has four paths, as mentioned above, the frequency Hc is selected to be equal to twice the desired frequency Fc for the resonator 16.

This makes it possible to provide a high-selectivity resonator which is easily programmable to a given resonance frequency merely by changing the frequency Hc which drives it by successively switching its paths, with such a frequency change being obtained in conventional manner by acting on the frequency synthesizer (not shown) in the clock 0.

Since the multipath filter 18 operates by sampling, it is necessary for it to be associated with an antialiasing filter 19 for preventing spectrum folding so as to limit the spectrum of the received signals in a manner which satisfies the condition set by Shannon's theorem.

The multipath filter 18 is also associated with a smoothing filter 20 at its output in order to smooth the steps in the output signals.

In the embodiment shown, the antialiasing filter 19 and the smoothing filter 20 are respectively driven by two auxiliary clock signals Ha1 and Ha2 and are each constituted in the form of lowpass filters having capacitors switched at the clock signal rate; they are both therefore programmable.

Naturally, the antialiasing filter and the smoothing filter could also be constituted by non-variable filters, depending on requirements.

In accordance with the invention, the resonator 16 is additionally associated with a comb filter 17 organized around a delay line 21 of the charge transfer type.

This delay line 21 comprises P steps, for example 1024 steps. Its delay T is programmable by acting on the frequency of the clock signal Hb which is applied thereto by the clock 0.

In a first variant embodiment of the comb filter, the delay line 21 has its input connected to the output from an inverting amplifier 22 and has its output connected to a first input of a summing circuit 23 whose second input receives the signal from the resonator 16 in parallel with the input to the inverting amplifier 22.

Another antialiasing filter 24 and another smoothing filter 25 are placed upstream and downstream respectively about the assembly constituted by the inverting amplifier 22, the delay line 21, and the summing circuit 23, and they serve the same functions for this assembly as do the filters 19 and 20 for the multipath filter 18. The filters 24 and 25 are respectively driven by clocks Ha3 and Ha4.

The amplitude response of the matched filter 8 as a function of frequency is shown in FIG. 3.

As mentioned above, the center frequency is fixed by the resonator 16, and more precisely by the frequency Hc of the clock signal applied to said resonator. The width of the lobe B is equal to the reciprocal of the delay T and is fixed by the delay line 21, and more precisely by the frequency Hb with which said line is driven, given that $B = Hb/P$.

The speed of response of the filter is determined by the selected lobe width.

The resonance frequency of the resonator 16 is caused to coincide with one of the frequencies for which the attenuation of the comb filter 17 is at a maximum.

The frequency of each of the clock signals Ha and Hb may be varied so long as the equality $Fc = k.B$ is satisfied, where k is a positive integer.

The above-mentioned variant may be adapted for the purpose of providing selective filtering of a plurality of predetermined low frequencies by connecting identical matched filters in parallel which are driven by different clock signals, with the assembly constituting a bank of filters which are non-variable or programmable depending on requirements.

Figure 4:
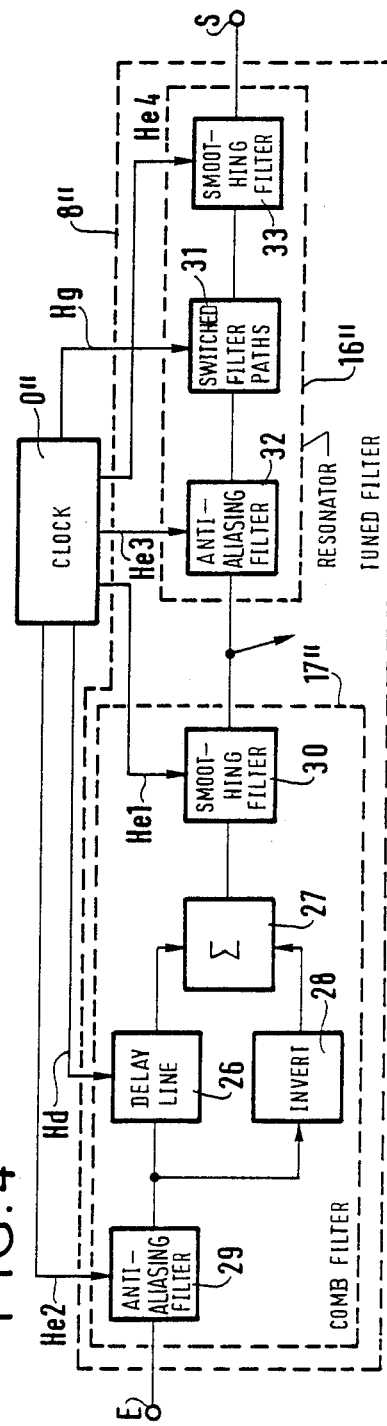
FIG. 4 is a block diagram, similar to FIG. 2, of a second filter in accordance with the invention.
Figure 5:
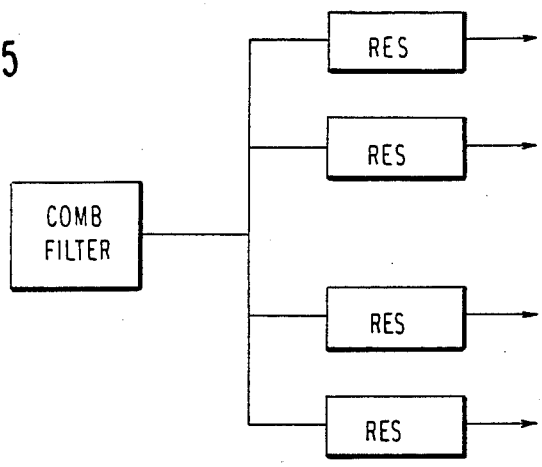
FIG. 5 is an illustration of a bank of matched filters formed by a single comb filter with a plurality of resonators connected to its output.
Figure 6:
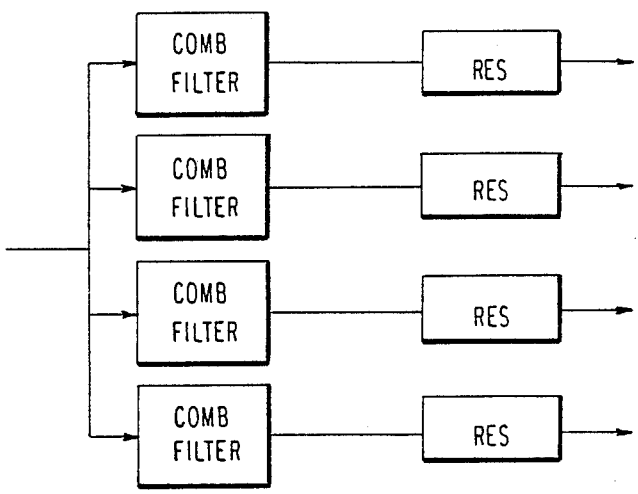
FIG. 6 is an illustration of a matched filter bank formed of plural comb filters each having a different resonator connected to its output.

The variant embodiment shown in FIG. 4 while still enabling a single predetermined low frequency to be recognized also makes it possible to limit the number of comb filters to one only even when a plurality of predetermined low frequencies need to be selected.

The matched filter or bank of matched filters 8″ obtained in this way comprises at least one comb filter 17″ and one or more resonators 16″ downstream from the comb filter. A clock 0″ analogous to the clock 0 is used for programming the tuned filter 8″ to meet requirements.

The comb filter 17″ is likewise organized about a delay line 26 of the charge transfer type which is driven by a clock signal at a frequency Hd.

The comb filter 17″ may optionally be identical in structure to the comb filter 17 shown in FIG. 2.

In the variant embodiment shown in FIG. 4, the summing circuit 27 has its two inputs respectively connected to the output from the delay line 26 and to the output from the inverting amplifier 28, with the delay line and the inverting amplifier being connected in parallel to the output from an anti spectrum folding filter 29 connected to the input of the tuned filter 8″ in order to receive the signals to be processed. Naturally, this variant embodiment of the comb filter as shown in FIG. 4 can also be used instead of the variant shown in FIG. 2 in the context defined by said FIG. 2.

In the example shown in FIG. 4, a smoothing filter 30 is connected to the output from the summing circuit 27. It is driven by a clock signal He1 supplied by the clock 0″, which also provides a clock signal He2 to the antialiasing filter 29.

The comb filter 17″ obtained in this way is programmed in the same way as the comb filter 17, and its amplitude response conventionally comprises a series of equal-width arches which are of equal amplitude in the selected telephone low frequency band.

The output from the comb filter 17″ is connected, in this case, to a single resonator 16″, but it should be understood that a plurality of resonators centered on different frequencies may be connected in parallel to said output if it is intended to selectively filter a plurality of low frequencies, with the assembly then constituting a bank of filters which are non-variable or programmable depending on requirements.

The resonator 16″ is organized about a multipath filter 31 which is analogous to the multipath filter 18 mentioned above and which is controlled, in this case, by a clock signal Hg produced by the clock 0″.

An antialiasing filter 32 and a smoothing filter 33 are respectively connected between the comb filter 17″ and the multipath filter 31, and downstream from said filter. Each of them is controlled by a respective clock signal He3 and He4 from the clock 0″.

The smoothing filter 30 may optionally be combined with the antialiasing filter 32, and similarly the filters 20 and 24 may be combined in the variant of FIG. 2.

When a plurality of resonators such as 16″ are connected in parallel to the output from the comb filter 17″, the clock signals of frequency Hg1, Hg2, Hg3, . . . , which determine the respective resonant frequencies thereof are organized to satisfy the conditions for a single comb filter and resonator, as defined above when describing the previous embodiments.

In either case, a filter in accordance with the invention can therefore be programmed by acting on the frequencies of the clock signals supplied thereto.

Naturally, it is also possible to implement banks of filters by the same method in which each bank comprises a plurality of comb filters which receive the signal to be processed in parallel and each of which feeds the input of a different resonator, thus providing an embodiment which is easy to design and which is not shown herein.

We claim:

1. A method of implementing a matched filter suitable for being programmed on request, for a receiver of information transmitted telegraphically by manipulating amplitude, frequency, or phase, said method comprising the steps of:

providing at least one high-selectivity resonator which is organized around a multipath filter and which has a resonance frequency controlled by a first clock signal, providing at least one comb filter which is organized about a delay line of the charge transfer type and which has a lobe width controlled by a second clock signal, and coupling said resonator and comb filter in cascade; and selecting said resonator clock signal and said comb filter clock signal such that resonance frequency of the resonator equal to an integer multiple of the comb filter lobe width, whereby a center frequency of said matched filter is fixed by said first clock signal and a lobe width of the matched filter is fixed by said second clock signal.

2. A programmable matched filter for receiving information transmitted telegraphically by manipulating amplitude, frequency, or phase, in particular for remote protection equipment, the filter comprising:

at least one high-selectivity resonator organized around a multipath filter and having a resonance frequency determined by resonator clock signals, at least one comb filter connected in series with said resonator and organized about a delay line of the charge transfer type, said comb filter having a lobe width determined by filter clock signals, and a clock signal source for providing said resonator and filter clock signals, with the frequency of said filter clock signals and the frequency of said resonator clock signals being selected in such a manner that the resonance frequency of the resonator is equal to an integer multiple of the lobe width.

3. A programmable matched filter according to claim 2, wherein the comb filter comprises a delay line of the charge transfer type and an inverting amplifier which have their inputs interconnected to receive the signals to be processed and which have their outputs connected to respective inputs of a summing circuit.

4. A programmable matched filter according to claim 2, wherein the comb filter comprises a summing circuit which receives the signal to be processed both directly on a first input and, on a second input, via an inverting amplifier and the delay line connected in cascade.

5. A programmable matched filter according to claim 2, wherein the comb filter is provided firstly with an antialiasing filter upstream from the input to comb filter per se, and secondly a smoothing filter downstream therefrom.

6. A programmable tuned filter according to claim 2, including at least one resonator constituted by an antifolding filter, a multipath filter, and a smoothing filter connected in cascade.

7. A bank of programmabe matched filters constituted by filters according to claim 2, wherein the bank comprises as many resonators as there are modulation low frequencies to be extracted, with each resonator having its output connected to the input of a comb filter with which it constitutes a filter unit, with each filter unit constituted by a resonator and a comb filter being tuned to a frequency to be extracted by means of clock signals, one of which is applied to the resonator and the other of which is applied to the comb filter, in such a manner as to cause the resonance frequency of the resonator to correspond with one of the frequencies of maximum attenuation of the comb filter.

8. A bank of programmable matched filters based on a filter according to claim 2, the bank comprising a comb filter having a set of n resonators connected in parallel to its output, said resonators having respective resonance frequencies corresponding to the frequencies to be extracted and fixed in such a manner as to correspond to different frequencies of maximum attenuation of the comb filter by means of individual clock signals applied selectively to the resonators and to the comb filter.

9. A bank of programmable matched filters based on a filter according to claim 2, comprises a plurality of comb filters receiving the signal to be processed in parallel, and each connected to the input of a different resonator.

* * * * *